United States Patent

Gutelius, Jr. et al.

[19]

[11] Patent Number: 6,094,800
[45] Date of Patent: Aug. 1, 2000

[54] METHOD FOR INSTALLING A MECHANISM WHICH PROTECTS AGAINST EARTHQUAKE DAMAGE IN ELECTRICAL EQUIPMENT

[75] Inventors: James B. Gutelius, Jr., Germantown; Steven C. McIntosh, Kingston; Budy D. Notohardjono, Poughkeepsie, all of N.Y.

[73] Assignee: International Business Machines Corporation, Armonk, N.Y.

[21] Appl. No.: 09/119,994

[22] Filed: Jul. 21, 1998

[51] Int. Cl.$^7$ ...................................................... B23P 11/00
[52] U.S. Cl. ..................................... 29/525.01; 29/525.02; 29/525.11; 52/698; 52/DIG. 11; 248/638
[58] Field of Search ............................ 29/525.01, 525.02, 29/525.11; 248/638, 680, 681; 52/167.4, 698

[56] References Cited

U.S. PATENT DOCUMENTS

| | | | |
|---|---|---|---|
| 2,756,952 | 7/1956 | Gazley | 248/13 |
| 4,356,992 | 11/1982 | Benkert | 248/578 |
| 5,702,087 | 12/1997 | Tsukamoto et al. | 248/638 |
| 5,813,650 | 9/1998 | Tsukamoto et al. | 248/638 |
| 5,867,952 | 2/1999 | Takayoshi et al. | 52/167.5 |
| 5,875,601 | 3/1999 | Gutelius, Jr. et al. | 52/698 |

*Primary Examiner*—David P. Bryant
*Assistant Examiner*—Essama Omgba
*Attorney, Agent, or Firm*—Floyd A. Gonzalez; Lawrence D. Cutter; Cantor Colburn LLP

[57] ABSTRACT

A method is provided which permits easy, in-the-field installation of an earthquake damage control mechanism. In particular, the mechanism comprises a turnbuckle having threaded yokes disposed at opposite ends of the turnbuckle together with eyebolts disposed within the yoke portions of the threaded yokes as a means for providing a retention device for anchoring relatively heavy computer and/or other equipment in position during seismological events. The electrical equipment is disposed within a frame which preferably includes a plurality of metal plates disposed at the bottom thereof. The frame is also provided with casters which permit the equipment to be rolled conveniently into place and then anchored firmly into position using a small number of pins which extend through the threaded yokes and eyebolts. There is provided an easily assemblable and economical apparatus which preferably includes a multiplicity of energy absorption points which help to prevent damage to the expensive computer frame and which further assists in maintaining computer operations at peak levels even during certain seismological activity.

6 Claims, 7 Drawing Sheets

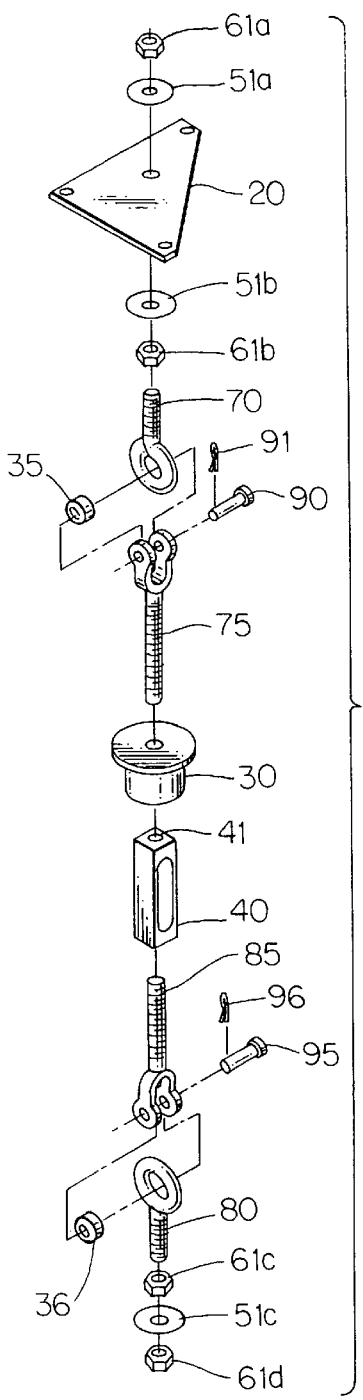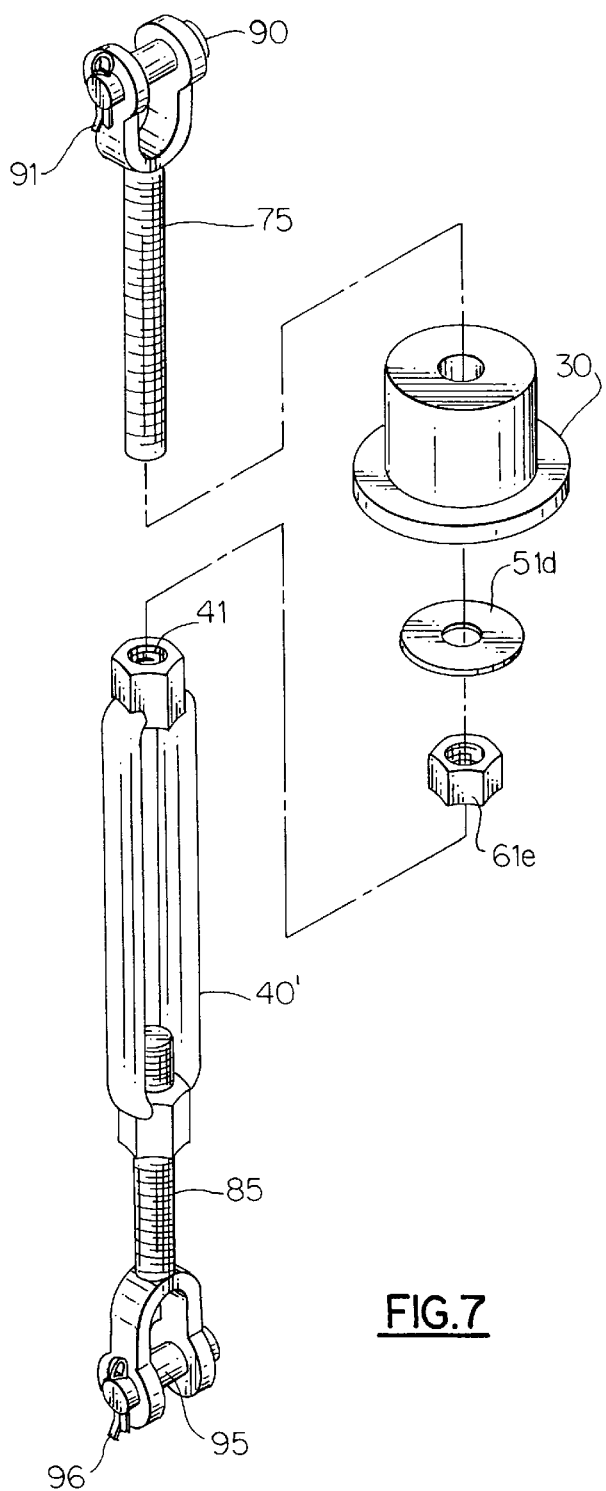
FIG. 2
FIG. 7

METHOD FOR INSTALLING A MECHANISM WHICH PROTECTS AGAINST EARTHQUAKE DAMAGE IN ELECTRICAL EQUIPMENT

BACKGROUND OF THE INVENTION

The present invention is generally directed to a mechanism for the retention and anchoring of electrical equipment to prevent damage to it during seismological events. More particularly, the present invention is directed to an anchoring and energy-absorbing mechanism for use with heavy electronic equipment such as mainframe computers. Even more particularly, the present invention is directed to a mechanism and method for convenient installation and removal of electrical equipment, especially mainframe computers.

Most seismological events are small and, therefore, do not have any significant influence on the operation of various kinds of electrical equipment. On the other hand, at the other end of the seismological spectrum, major damage to buildings and architectural structures including the collapse of these structures cannot be prevented nor are there reasonable approaches for protecting equipment therein when such buildings collapse. Nonetheless, there is an intermediate spectrum of seismological events wherein damage can be done to the frame and structures of relatively heavy computer equipment, especially to equipment weighing between approximately 1,000 and 2,000 pounds, or more. Such equipment typically includes relatively large server or mainframe computers.

Within this intermediate range of seismological events, it becomes possible to provide a degree of protection which serves to increase the probability that the equipment remains operational after the event. A significant step in this direction is providing a mechanism which ensures that the frame in which the electronic equipment is disposed is not bent or fractured. Damage to the frame and to the corresponding electrical connection supported by the frame becomes more likely in stronger seismological events. These seismological events can produce destructive accelerations. As a result of this acceleration and the relatively large mass associated with certain larger pieces of computer or electrical equipment, there is a correspondingly relatively high energy imparted to the equipment structure during earthquake activities. These energies must somehow be contained so as to reduce destructive relative motions of the heavy equipment assembly.

For most purposes and locations, seismological activity is not such a problem as to require anchoring or restraint mechanisms. However, in certain critical applications such as air traffic control, retention mechanisms become much more significant and highly desirable. Likewise, in locations where seismological activity is relatively high, protection of relatively expensive electrical equipment becomes more of a significant concern.

If one is attempting to restrain relatively light weight equipment, then it is possible to employ fixed or flexible restraints having multiple degrees of freedom. However, such designs do not work well for heavy equipment. The induced motion in a vertical or horizontal direction which is permitted in a multi-degree of freedom fixed restraint system can cause damage to the equipment, frame and structure. Furthermore, simple bolting mechanisms do not always work well because of the excessive load supplied to the single joint point of attachment. Similarly, mechanisms employing either free or locked casters or wheels are unacceptable in many mid-range seismological events of the magnitude considered herein. Additionally, other flexible restraint and/or fixed restraint systems have been found wanting in terms of high stress load and their inabilities to sufficiently absorb energies induced by various motions encountered during seismological events. These motions include movement in directions other than the vertical direction. It is particularly noted that during seismological events, various twisting and turning motions may be induced as a result of the motion of the underlying earth crustal plate structures and the motions of the buildings in which the equipment is deployed.

It is also important that any mechanism for anchoring or restraining relatively heavy equipment be designed so that it is convenient to use and can be installed with ease in any number of different locations. It is also highly desirable that the equipment can be easily placed, anchored and installed in the field.

SUMMARY OF THE INVENTION

In accordance with one embodiment of the present invention, heavy electrical equipment such as a mainframe computer is attached to an underlying fixed structure such as a floor by means of a sequence of eyebolts, threaded yokes and turnbuckles which connect the equipment to a fixed structure. In preferred embodiments of the present invention, the equipment is mounted in a frame structure, the bottom of which includes four triangular plates. Each of the plates has an eyebolt attached thereto by means of an arrangement of nuts and load-distributing washers. The eyebolt may also be welded to the plate. This eyebolt is disposed within the yoke portion of a threaded yoke which passes through a bushing inserted in a corresponding opening in a raised floor structure. The other end of the threaded yoke is disposed within a threaded opening of a turnbuckle. In preferred embodiments of the present invention, the other end of the turnbuckle also includes another threaded yoke which is attached thereto and has a yoke portion which receives a second eyebolt which is firmly attached to a fixed structure such as a floor, subfloor, column, girder or some other rigid portion of a building.

In one aspect of the present invention, a preferred embodiment includes a combination of the equipment and the seismological retention structure described herein. In another preferred embodiment, the present invention includes an assembly of parts, some which may be pre-assembled. Such a collection of parts may be shipped prior to computer installation. In yet another embodiment of the present invention, a method is provided for conveniently installing mainframe computer units. This method provides convenience and flexibility while retaining full anchoring, retention and energy absorption capabilities while still providing sufficient design flexibility to accommodate raised floors having different depths. It is furthermore noted that the structure of the present invention is designed in a manner in which it is possible to use as many off-the-shelf parts as possible. This makes construction and utilization of the present invention not only very easy, but also very economical.

Accordingly, it is an object of the present invention to provide a mechanism for anchoring and for restraining the movement of equipment during earthquakes and/or seismological events.

It is also an object of the present invention to provide a retention and anchoring arrangement for heavy electrical or electronic equipment including mainframe or server devices.

It is yet another object of the present invention to provide an anchoring and retention mechanism which can be installed and positioned prior to or even after initial installation of a computer system.

It is still another object of the present invention to provide a mechanism for computer installation in as rapid a time as possible while still providing a mechanism to prevent damage to computer equipment during seismological events.

It is yet another object of the present invention to provide a retention and anchoring mechanism against seismological motion.

It is a still further object of the present invention to provide an anchoring and retention mechanism which can be readily constructed from economical, off-the-shelf components.

It is also an object of the present invention to provide an anchoring and retention mechanism which is capable of absorbing relatively large amounts of seismically induced energies so as to prevent damage to the frame of the structure housing the equipment to be protected.

It is yet another object of the present invention to permit the use of wheels or casters on heavy electrical equipment without sacrificing the ability to include earthquake and/or motion retention mechanisms.

It is also an object of the present invention to provide an installation method which is flexible and convenient.

It is a still further object of the present invention to prevent damage to equipment-holding frame structures during earthquake events.

It is yet another object of the present invention to provide a field-installable mechanism for protection against seismological or other undesirable motions.

It is also an object of the present invention to provide an earthquake protection mechanism which is adaptable to different raised floor depths.

Lastly, but not limited hereto, it is an object of the present invention to prevent earthquake damage to heavy electrical or electronic equipment.

BRIEF DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

FIG. 2 is an exploded view of an anchoring or retention apparatus in accordance with the present invention;

FIG. 7 is an exploded isometric view, of one embodiment of a retaining structure in accordance with the present invention, which particularly illustrates an inverted bushing and a long version of a turnbuckle;

DETAILED DESCRIPTION OF THE INVENTION

Figure 1:
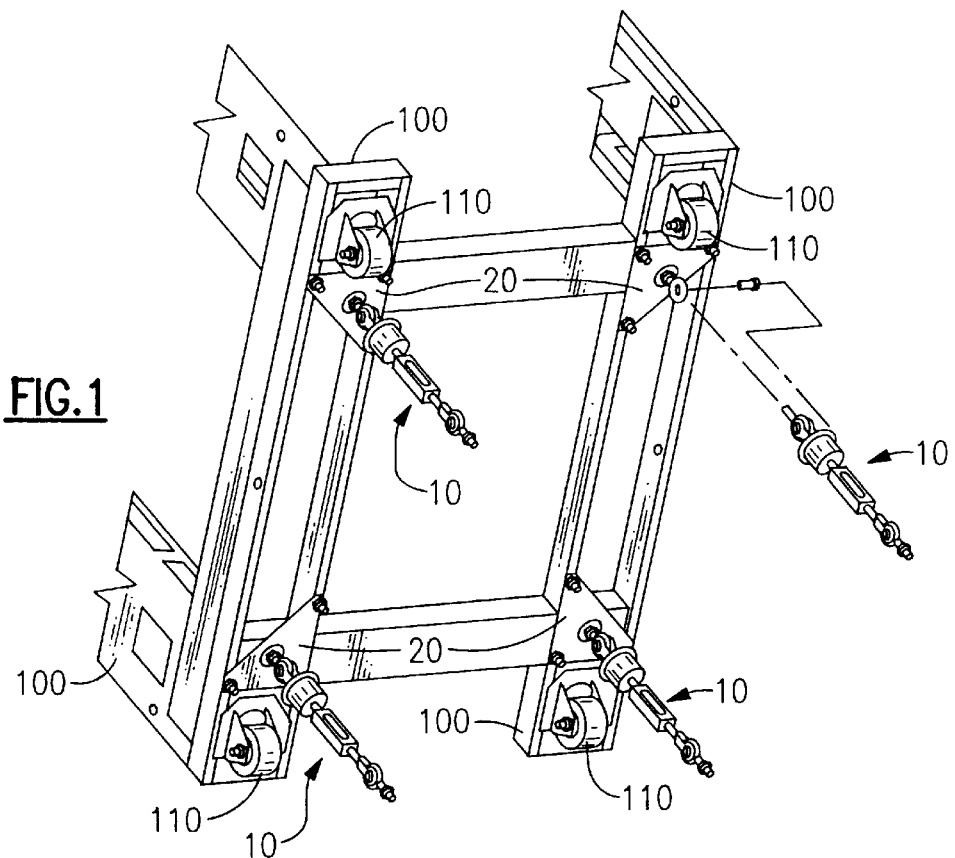
FIG. 1 is an isometric view of the underside of an equipment frame showing placement and connection for the retention and anchoring devices of the present invention.

FIG. 1 illustrates the preferred placement and attachment of four devices 10 of the present invention on the bottom of frame 100 which is configured to hold various forms of electrical and/or electronic equipment. In particular, frame 100 shown in FIG. 1 is particular suited for the containment of computer systems weighing between approximately 1,000 and 2,000 pounds, or more. Retention devices 10 are attached to the bottom of frame 100 by means of plates 20 which are firmly bolted to the bottom of frame 100. Plate 20 may be provided in any convenient shape. However, in accordance with preferred embodiments of the present invention, plates 20 are triangular in shape and are preferably four in number disposed at the corners of the bottom of frame 100. In preferred embodiments of the present invention, the long edges of triangular plates 20 are affixed to the bottom of frame 100 so as to be directed towards the central area of the bottom of frame 100, as shown in FIG. 1.

One of the major advantages of the present invention is its convenience. In particular, casters 110 disposed on the bottom of frame 100 permit the apparatus to be rolled into place and quickly connected to pre-assembled portions of device 10 which extend upwards from a fixed floor through a raised floor structure. In particular, retention devices 10 are preferably put into position prior to the installation of a computer system. Once devices 10 are in place, it is a simple matter to roll frame 100 into position and to connect the frame to the floor retention assembly as shown simply by means of four pins through eyebolts as is more particularly described below in connection with FIG. 2.

Figure 12:
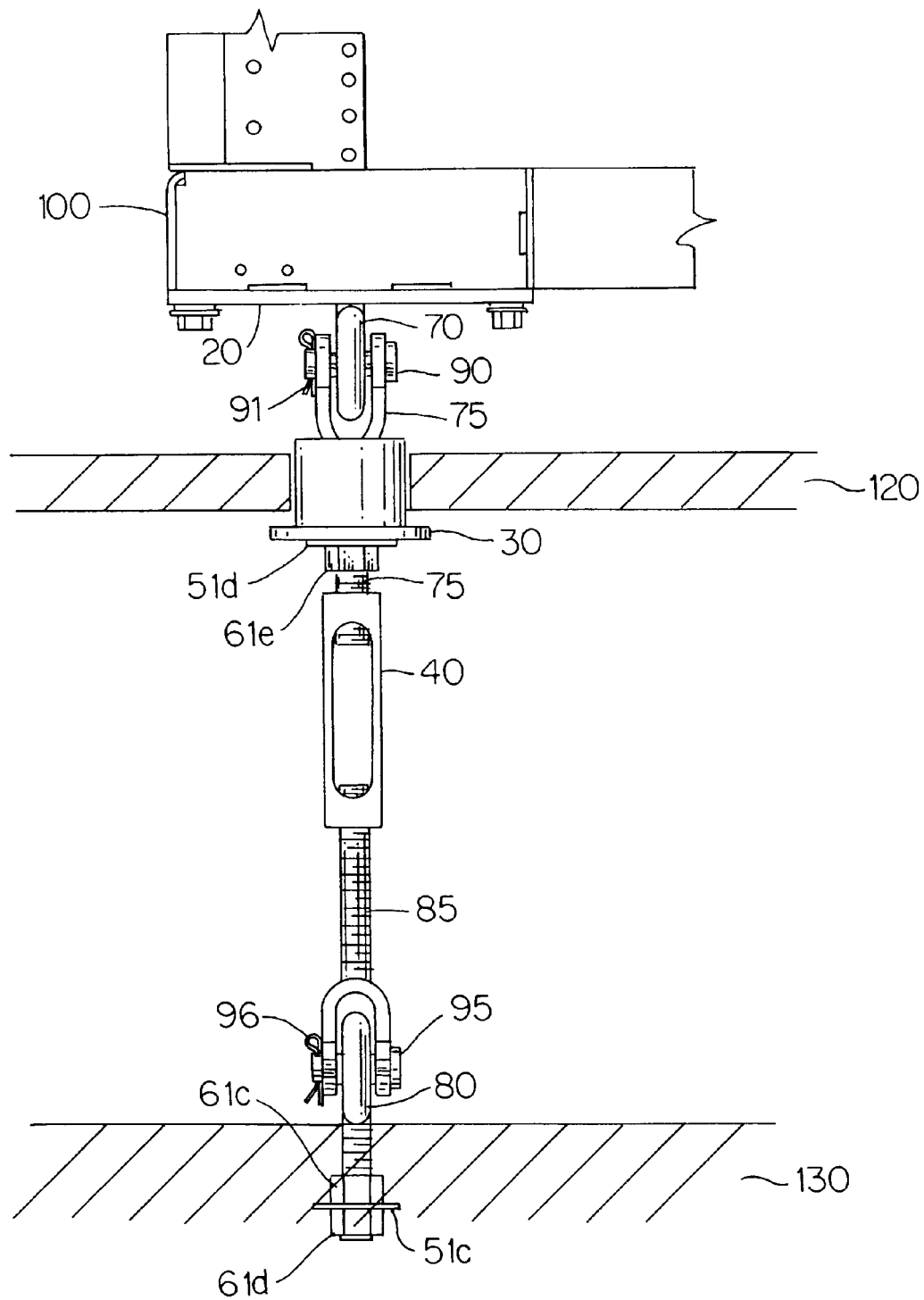
FIG. 12 is a view similar to FIG. 9 except that it illustrates the inclusion of a shorter version of a turnbuckle.

FIG. 2 illustrates an earthquake retention assembly in accordance with the present invention. It is also noted that for purposes of illustration, FIG. 2 also includes plate 20. However, it is noted that reference numeral 10 does not in fact refer to an assembly which includes plate 20. Plate 20 does, nonetheless, include eyebolt 70 which is attached to a central aperture in plate 20 by means of nuts 61a and 61b. Eyebolt 70 possesses a threaded portion which extends firstly through nut 61b thence through washer 51b, plate 20, washer 51a and finally through nut 61a. Washers 51a and 51b better distribute the load applied by nuts 61b and 61a during tightening. Eyebolt 70 may also be welded to plate 20. In a typical assembly, plate 20 and attached eyebolt 70 are in position on the bottom of frame 100 prior to final computer installation. Before the final installation in which the computer is rolled into place and connected to the underlying structure via pin 90, the retention assembly of the present invention is typically already partially installed. In particular, the present invention is installed through a subfloor (see FIGS. 6, 9 and 12) so as to ultimately attach computer equipment to a fixed structure of a building. This fixed structure (130 in FIGS. 9 and 12) is any convenient floor, beam or other rigid structure which is part of the building in which the equipment is to be installed.

Figure 8:
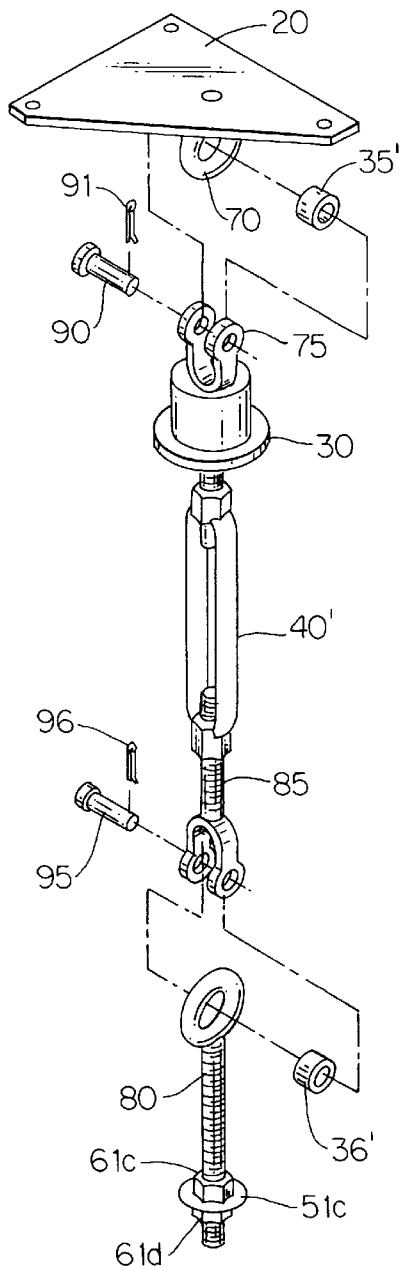
FIG. 8 is an exploded isometric view, of one embodiment of a retaining structure in accordance with the present invention, which particularly illustrates the use of an alternate form of bushing.
Figure 11:
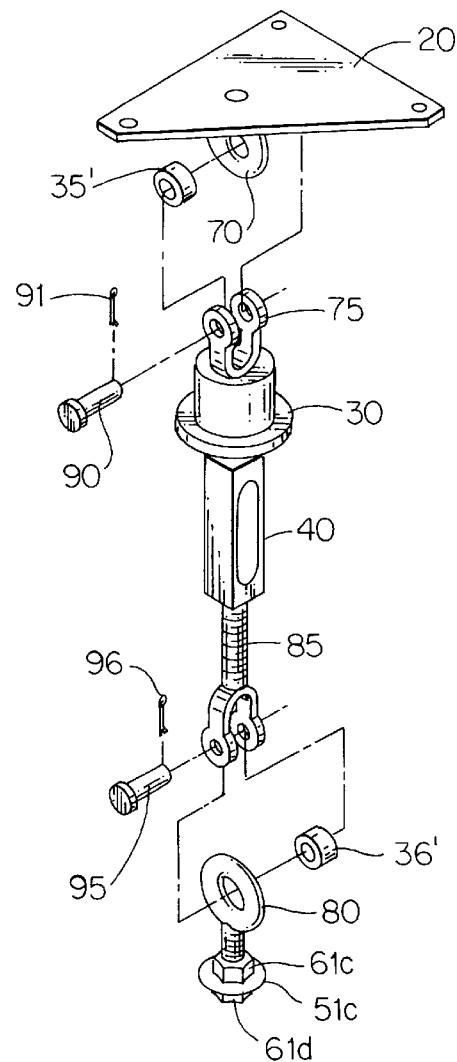
FIG. 11 is a view similar to FIG. 8 except that it illustrates the inclusion of a shorter version of a turnbuckle.

In a typical installation process, eyebolt 80 is fastened to this rigid building structure by means of nuts 61c and 61d and washer 51c. Threaded eyebolt 80 also preferably includes nut 36 (or bushings 35 or 36 as shown in FIGS. 8 and 11) which is disposed within the eye of the threaded eyebolt to act as a bushing and energy-absorbing mechanism. In particular, the utilization of nuts 35 and 36 as eyebolt bushings herein serve to assist in the desire to be able to construct the apparatus of the present invention using readily available, off-the-shelf components. This not only increases availability but also decreases the economic costs of the device.

Figure 9:
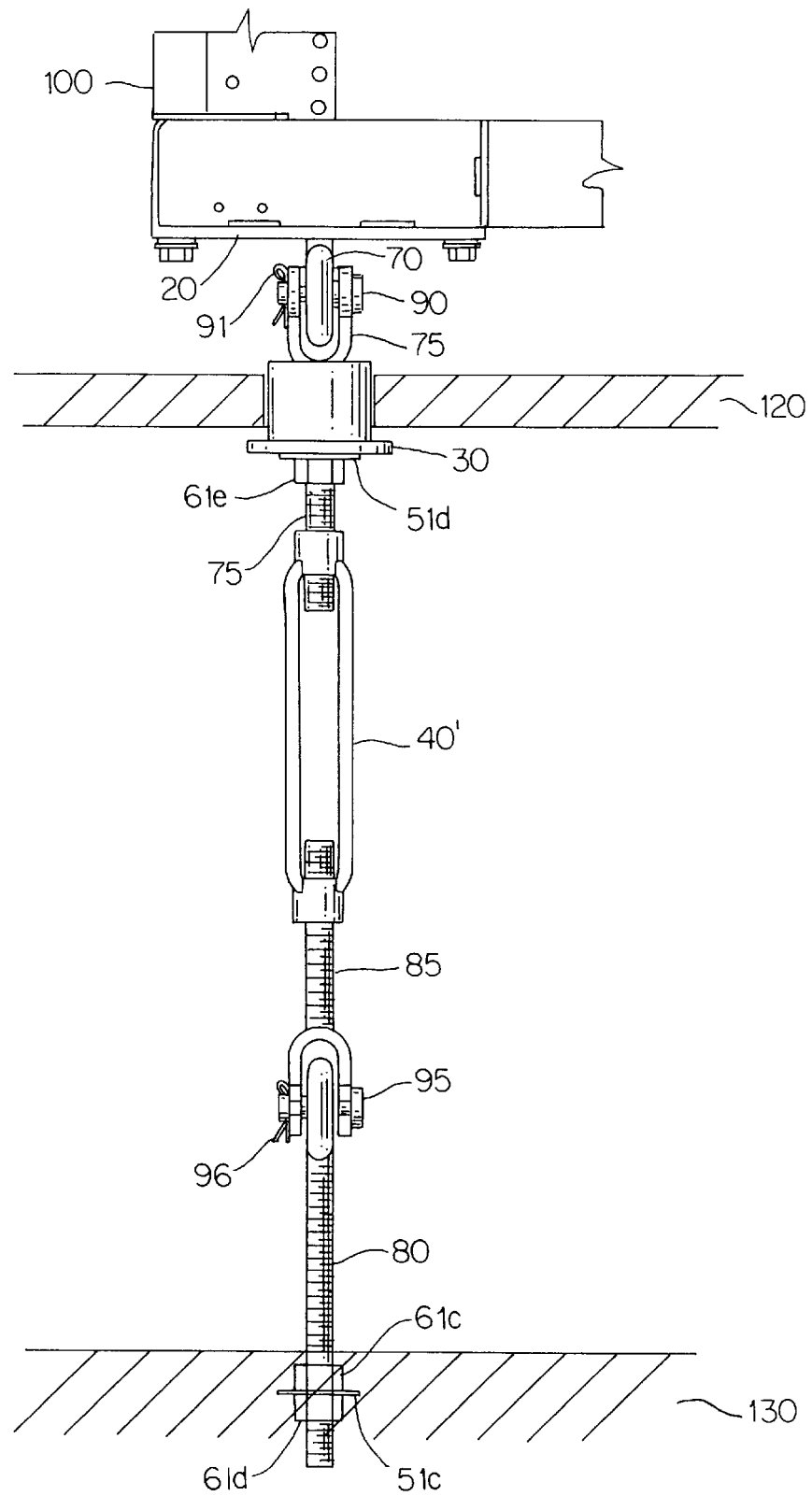
FIG. 9 is an isometric view illustrating one embodiment of the present invention illustrating an alternate placement and orientation of a through-floor bushing and the use of a longer turnbuckle version.
Figure 10:
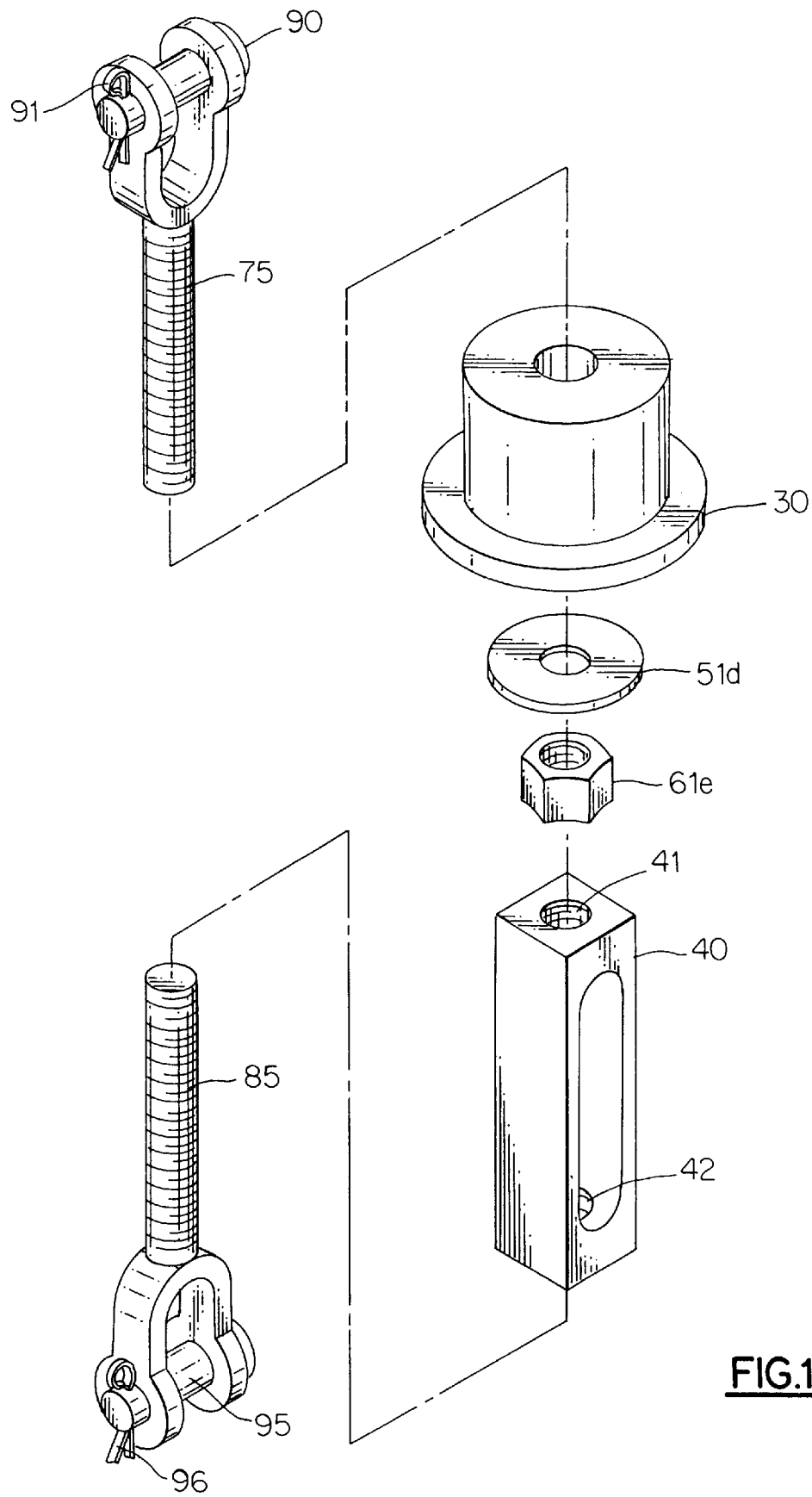
FIG. 10 is a view similar to FIG. 7 except that it illustrates the inclusion of a shorter version of a turnbuckle.

Threaded yoke 85 has a yoke portion which straddles the eye of eyebolt 80 and is affixed thereto by means of pin 95 which extends through holes in the yoke portion and also extends through the center of nut 36. Pin 95 is held in place by means of cotter pin 96 which extends through pin 95 to retain it in position and to thus hold threaded yoke 85 in position. The threaded portion of threaded yoke 85 is disposed within a threaded opening 42 of turnbuckle 40 (see FIG. 4). Turnbuckle 40 preferably includes a central opening for receipt of a lever device which may be employed to tighten the assembly and to more firmly anchor the equipment to the floor. For purposes of the present invention, a turnbuckle is any suitably sized device having oppositely disposed threaded openings which are threaded so that rotation of the turnbuckle moves threaded shafts disposed therein in opposite directions for purposes of tightening or loosening. Turnbuckles illustrated herein include short versions 40 (as shown in FIGS. 2, 4, 6, 10, 11 and 12) and long versions 40 (as shown in FIGS. 7, 8 and 9). Turnbuckles of any convenient length may also be provided. However, the two turnbuckle designs illustrated herein are sufficient to accommodate a very high percentage of raised-floor heights.

Figure 6:
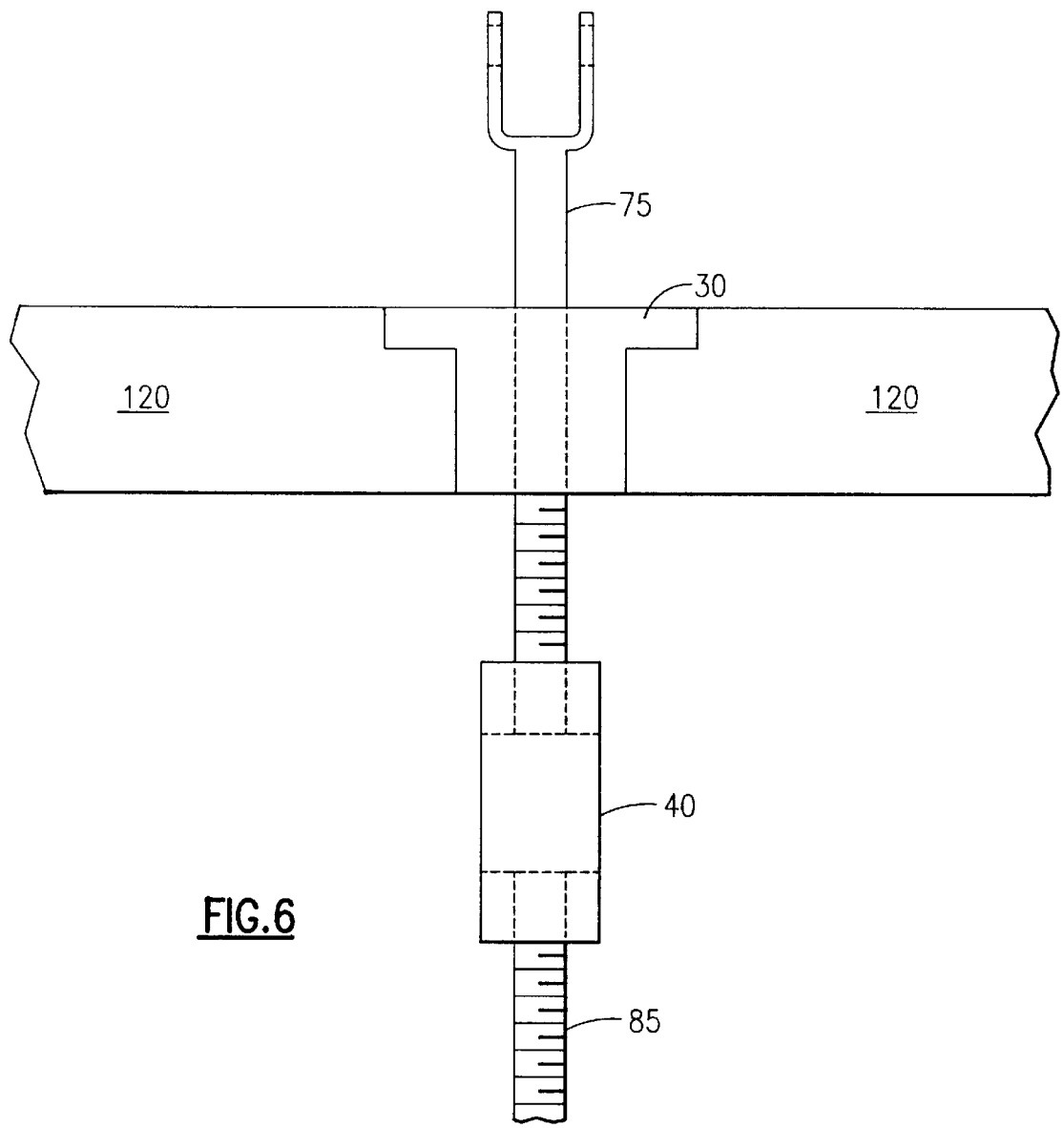
FIG. 6 is a side elevation view illustrating one embodiment of the relationship between various portions of the anchoring or retention mechanism of the present invention and a subfloor and particularly illustrating the role and placement of the through-floor bushing shown in FIGS. 1, 2 and 3.

Turnbuckle 40 also includes a second threaded opening 41 at its opposite end for receipt of the threaded portion of threaded yoke 75. Threaded yoke 75 extends downwardly through a central opening in bushing 30 which preferably comprises any convenient elastomeric material. The upper surface of bushing 30 is meant to lie flush with the top of raised floor 120 as shown in FIG. 6. Thus, during a typical installation operation, threaded yoke 75 is inserted downwardly through bushing 30 which is already present in a raised floor structure. Threaded yoke 75 is then inserted by means of a threading operation into the upper threaded opening of turnbuckle 40 to a depth sufficient to place the yoke portion of threaded yoke 75 into alignment with the eye of eyebolt 70.

In preferred installation operations, as many of the anchoring mechanisms 10 as is desirable are inserted through openings in raised floor 120. As many retention devices 10 as is desired are employed. During final installation, frame 100 containing relatively heavy electrical or electronic equipment is rolled into position and aligned with the yoke portions of threaded yokes 75 which extend upwardly through raised floor 120. Final assembly is accomplished by means of insertion of pins 90 through openings in the yoke portion of threaded yoke 75 and through the center of nut 35 disposed within the eye of eyebolt 70. Cotter pin 91 is then disposed through an opening in pin 90 to hold the assembly together. At this point, turnbuckle 40 is turned so as to apply a desired level of tension to the assembly.

Figures 3, 4:
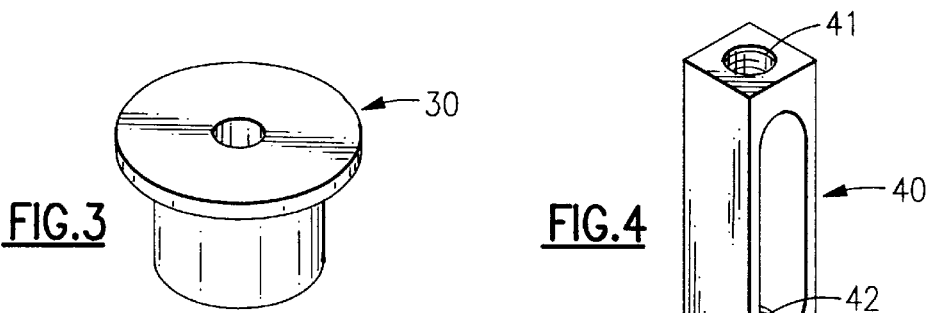
FIG. 3 is a detailed isometric view of the through-floor bushing employed in the present invention.
FIG. 4 is a detailed isometric view of a turnbuckle (short version) employed in the present invention to adjust the tension in the anchoring apparatus which holds the frame to a fixed structure.
Figure 5:
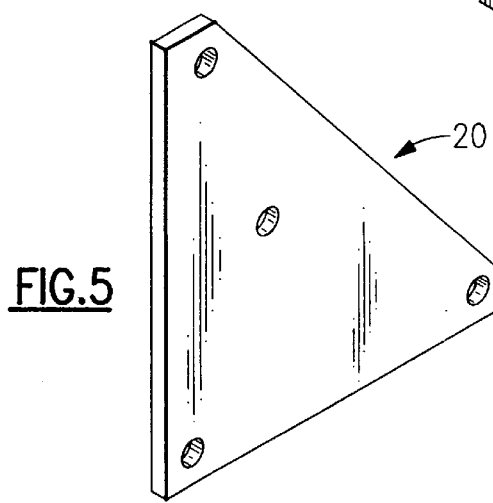
FIG. 5 is a detailed isometric view of a plate which is disposed on the bottom of the frame.

FIGS. 3, 4 and 5 provide more detailed views of bushing 30, turnbuckle 40 and plate 20. Likewise, FIG. 6 more particularly illustrates the disposition of threaded yoke 75 through bushing 30 disposed in raised floor 120. Also illustrated is the connection between threaded yokes 75 and 85 through turnbuckle 40.

The utilization of plate 20 in the present invention provides an important level of protection which is not provided if eyebolt 70 were to be connected directly to frame 100. If one were to perform this direct connection, it is more likely that frame 100 would be significantly damaged in an earthquake. However, by providing plate or plates 20, there results a mechanism in which energy imparted to the heavy equipment during an earthquake is absorbed by means of the bending and flexing of plate or plates 20. This provides a very high degree of energy absorption capability while at the same time maintaining the computer equipment in a relatively fixed position. Plates 20 also provide convenient positioning and placement for eyebolts 70 which are simultaneously placed into alignment with all of the desired yokes simply by rolling the cabinet and frame into place using casters 110. It is additionally noted that the structure and apparatus provided in the present invention does not simply comprise a single eyebolt such as eyebolt 80 extending upwardly from a fixed rigid subfloor. While such an arrangement is physically possible, such an arrangement would not provide the desired degree of energy absorption during a seismological (or other) event. Nor would such an apparatus provide the flexibility and alignment and height tolerances afforded by the inclusion of a device such as turnbuckle 40 which not only permits variations in initial height but also provides a mechanism for applying sufficient tension within the apparatus. Turnbuckle 40 also provides additional energy absorption capability. However, it is noted that in accordance with one variation of the present invention, threaded yoke 85 and eyebolt 80 could be replaced by a single threaded rod. However, this is not a preferred embodiment of the present invention since the inclusion of these elements adds extra energy absorption capabilities in terms of the cushioning effect of nut 36, potential bending of pin 95 and distortion of the yoke portion of threaded yoke 85. All of these structures provide some degree of energy absorption capability. Again, it is important to note that it is much preferred to have energy absorption occur in the earthquake retention device of the present invention than it is to have large amounts of energy absorbed within the frame structure. Energy transmitted in a sufficiently strong earthquake to a computer frame does have the capability of disrupting electrical connections within the frame, thus shutting down the computer system. However, as pointed out above, there are many times and many situations in which the continued operation of a computer system becomes of tantamount importance, such as in air traffic control situations or in defense systems.

One wants to provide as much protection as is reasonably possible in such circumstances. However, it is well recognized that, at some level of seismological or other activity, no precaution is sufficient.

In a typical equipment installation operation, the lower eyebolts are attached to a fixed structure 130 below the raised floor which supports the equipment. A first threaded yoke is connected to the lower eyebolt and is in turn inserted into the turnbuckle. A second threaded yoke is inserted through a bushing in the subfloor into an upper threaded opening in the turnbuckle. The threaded yokes are connected to the eyebolt holes by means of devices such as clevis pins which are further retained in position by means of a conventional cotter pin or similar member disposed through a hole in the pin. The turnbuckle and upper threaded yoke are turned so as to position the upwardly extending yoke at a desired height relative to the raised floor. The yokes are then preferably aligned so as to receive the eyebolts which extend downwardly from plates 20 when the equipment is rolled into place. Final attachment pins are disposed through the upper yoke and the downwardly extending eyebolts and the turnbuckle is tightened to ensure minimal equipment motion during an earthquake or other disturbance including explosions, natural or otherwise, occurring within or around the building in which the equipment is housed. The present invention is therefore seen not to be limited to protection against purely seismological events.

Accordingly, from the above, it should be appreciated that the present invention satisfies all of the objects set forth herein. In particular, the earthquake retention apparatus of the present invention provides an economical and extremely convenient method for installing computer and/or other heavy electrical equipment in situations and locations in which there is a higher than normal risk of seismological or other activity. It is furthermore noted that the retention apparatus of the present invention provides a mechanism for providing a plurality of localized energy absorption points disposed between a computer frame which is meant to be protected and a firm anchoring point. It is further noted that the present invention satisfies the objects set forth herein in that installation can be accomplished in a convenient manner and in a similar fashion removal of the equipment is likewise readily accomplished simply by removing one or more pins.

In preferred embodiments of the present invention, it is seen that four triangular plates are employed. However, in other circumstances, particularly with smaller and/or somewhat lighter weight equipment (less than 2,000 pounds), a single square or rectangular plate centrally disposed on the bottom of the equipment frame is employable while still remaining within the scope and concept of the present invention.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method of installing electrical or electronic equipment housed on a frame which has casters on the frame bottom and which also includes at least one plate with a first eyebolt extending downwardly therefrom, for each plate said method comprising:

affixing a second eyebolt to a fixed structure below a raised floor for supporting said equipment;

connecting to said second eyebolt a first threaded yoke which is threaded into a turnbuckle wherein a first clevis pin is inserted to connect said first threaded yoke to said second eyebolt, and, thereafter, a first cotter pin is attached to said first clevis pin to retain said first clevis pin in position;

disposing a second threaded yoke through said raised floor, said second threaded yoke then being threaded into said turnbuckle;

positioning said equipment with said first eyebolt aligned with the yoke portion of said second threaded yoke;

inserting a second clevis pin to connect said second threaded yoke to said first eyebolt wherein said second clevis pin is retained in position by attaching a second cotter pin to said second clevis pin; and turning said turnbuckle to anchor said equipment to said fixed structure.

2. The method of claim 1 wherein said turning of said turnbuckle is turned so as to position said second threaded yoke at a desired distance to said fixed structure.

3. A method of installing electrical or electronic equipment housed on a frame which has casters on the frame bottom and which also includes at least one plate with a first eyebolt extending downwardly therefrom, wherein said method further comprises:

moving said frame into a position above a fixed structure wherein said frame is rolled into position with said casters; and adjoining said frame to at least one retention device, wherein said adjoining of each plate and retention device further comprises:

affixing a second eyebolt to said fixed structure below a raised floor for supporting said equipment;

connecting to said second eyebolt a first threaded yoke which is threaded into a turnbuckle;

disposing a second threaded yoke through said raised floor, said second threaded yoke then being threaded into said turnbuckle;

positioning said equipment with said first eyebolt aligned with the yoke portion of said second threaded yoke;

inserting a pin to connect said second threaded yoke to said first eyebolt; and turning said turnbuckle to anchor said equipment to said fixed structure.

4. The method of claim 3 wherein said pin is a clevis pin.

5. The method of claim 4 further comprising:

positioning a cotter pin into said clevis pin to retain said clevis pin in position.

6. The method of claim 3 wherein said turning of said turnbuckle is turned so as to position said second threaded yoke at a desired distance to said fixed structure.

* * * * *